US009129636B2

(12) United States Patent
Kurokawa

(10) Patent No.: US 9,129,636 B2
(45) Date of Patent: *Sep. 8, 2015

(54) METHOD AND APPARATUS FOR MANUFACTURING MAGNETIC RECORDING MEDIUM

(75) Inventor: Gohei Kurokawa, Ichihara (JP)

(73) Assignee: SHOWA DENKO K.K., Tokyo (JP)

( * ) Notice: Subject to any disclaimer, the term of this patent is extended or adjusted under 35 U.S.C. 154(b) by 882 days.

This patent is subject to a terminal disclaimer.

(21) Appl. No.: 12/668,390

(22) PCT Filed: Jul. 3, 2008

(86) PCT No.: PCT/JP2008/062058
§ 371 (c)(1),
(2), (4) Date: May 27, 2010

(87) PCT Pub. No.: WO2009/008324
PCT Pub. Date: Jan. 15, 2009

(65) Prior Publication Data
US 2010/0227050 A1    Sep. 9, 2010

(30) Foreign Application Priority Data

Jul. 11, 2007  (JP) ................ P2007-182528

(51) Int. Cl.
*G11B 5/84*       (2006.01)
*C23C 14/56*      (2006.01)
*G11B 5/82*       (2006.01)

(52) U.S. Cl.
CPC ............. *G11B 5/84* (2013.01); *C23C 14/564* (2013.01); *C23C 14/568* (2013.01); *G11B 5/82* (2013.01)

(58) Field of Classification Search
None
See application file for complete search history.

(56) References Cited

U.S. PATENT DOCUMENTS

| 5,252,194 A | 10/1993 | Demaray et al. |
| 5,288,329 A * | 2/1994 | Nakamura et al. ............ 118/729 |
| 5,391,229 A | 2/1995 | Kosky et al. |

(Continued)

FOREIGN PATENT DOCUMENTS

| JP | 59-208071 A | 11/1984 |
| JP | 11-229150 A | 8/1999 |

(Continued)

OTHER PUBLICATIONS

United States Office Action issued in U.S. Appl. No. 12/668,366 dated Mar. 21, 2013.

(Continued)

*Primary Examiner* — Mandy Louie
(74) *Attorney, Agent, or Firm* — Sughrue Mion, PLLC

(57) ABSTRACT

The present invention provides a method for manufacturing a magnetic recording medium by mounting a substrate for film formation on a carrier, sequentially transporting said substrate into a plurality of connected chambers, and forming at least a magnetic film and a carbon protective film on said substrate for film formation within said chambers, wherein said method comprises a step of conducting ashing to remove an accumulated carbon protective film adhered to a carrier surface, which is performed following a step of removing a magnetic recording medium from said carrier following film formation, but prior to a step of mounting a substrate for film formation on said carrier.

15 Claims, 4 Drawing Sheets

(56) References Cited

U.S. PATENT DOCUMENTS

| | | | |
|---|---|---|---|
| 5,431,769 A * | 7/1995 | Kisakibaru et al. | 156/345.46 |
| 6,176,932 B1 * | 1/2001 | Watanabe et al. | 118/719 |
| 6,228,439 B1 | 5/2001 | Watanabe et al. | |
| 6,554,970 B1 * | 4/2003 | Benvenuti | 204/192.15 |
| 6,589,398 B1 | 7/2003 | Lu et al. | |
| 7,413,814 B2 * | 8/2008 | Conte et al. | 428/613 |
| 2001/0009154 A1 * | 7/2001 | Nguyen et al. | 134/1 |
| 2001/0010256 A1 * | 8/2001 | Nozawa et al. | 156/345 |
| 2003/0118731 A1 * | 6/2003 | He et al. | 427/307 |
| 2003/0159919 A1 | 8/2003 | Fairbairn et al. | |
| 2004/0099285 A1 * | 5/2004 | Wang et al. | 134/8 |
| 2004/0253476 A1 * | 12/2004 | Conte et al. | 428/660 |
| 2004/0255862 A1 * | 12/2004 | Lee et al. | 118/722 |

FOREIGN PATENT DOCUMENTS

| | | | |
|---|---|---|---|
| JP | 2002-025047 A | 1/2002 |
| JP | 2002-332570 A | 11/2002 |
| JP | 2006-173343 A | 6/2006 |
| JP | 2008-130100 A | 6/2008 |

OTHER PUBLICATIONS

Search Report issued in PCT/JP2008/062388 dated Sep. 30, 2008.
Japanese Office Action issued in application No. 2007-182529 dated Jun. 28, 2011.
Final Office Action issued in co-pending U.S. Appl. No. 12/668,366.

* cited by examiner

METHOD AND APPARATUS FOR MANUFACTURING MAGNETIC RECORDING MEDIUM

CROSS REFERENCE TO RELATED APPLICATIONS

This application is a National Stage of International Application No. PCT/JP2008/062058, filed Jul. 3, 2008, which claims priority from Japanese Patent Application No. 2007-182528, filed Jul. 11, 2007, the contents of all of which are incorporated herein by reference in their entirety.

TECHNICAL FIELD

The present invention relates to a method and apparatus for manufacturing a magnetic recording medium used in a hard disk device or the like, and more specifically, relates to a method and apparatus for manufacturing a magnetic recording medium in which a carbon film that has accumulated on the surface of a substrate-supporting carrier is removed by ashing, and the generation of dust and gas within the apparatus is reduced.

Priority is claimed on Japanese Patent Application No. 2007-182528, filed Jul. 11, 2007, the content of which is incorporated herein by reference.

BACKGROUND ART

In recent years, the improvements in the recording density of magnetic recording media has been dramatic, particularly in the field of magnetic disks, and recent recording densities have particularly increased at an extraordinary rate equivalent to an increase of approximately 100-fold in the last 10 years. Many different technologies are responsible for these huge improvements in recording density, but one of the key technologies has been technology for controlling the sliding characteristics between the magnetic head and the magnetic recording medium.

Since the CSS (contact start-stop) method known as the Winchester system, in which the basic operations involve contact sliding-head lifting-contact sliding between the magnetic head and the magnetic recording medium, has become the main system employed within hard disk drives, sliding of the head on the recording medium has become an unavoidable necessity, and therefore problems relating to tribology between the magnetic head and the magnetic recording medium are currently an unavoidable technical issue. As a result, the abrasion resistance and sliding resistance of the surface of a magnetic recording medium play an important role in determining the reliability of the medium, and intensive efforts continue to be directed towards the development and improvement of protective films and lubricating films and the like for lamination onto the magnetic film.

Various materials have been proposed as protective films for magnetic recording media, but from the overall viewpoints of film formability and durability and the like, carbon films are mainly employed. Carbon films are generally formed by sputtering methods, and the conditions during film formation are vividly reflected in either the corrosion resistance of the carbon film or the CSS characteristics, and are therefore extremely important.

Further, in order to improve the recording density, it is desirable to reduce the flying height of the magnetic head and increase the rotational speed of the medium, and therefore the magnetic recording medium requires a higher level of sliding durability.

On the other hand, in order to reduce spacing loss and thereby increase the recording density, the thickness of the protective film needs to be reduced as far as possible, for example to a film thickness of not more than 100 Å. There are strong demands for a protective film which is not only smooth, but also thin and tough.

However, when a carbon protective film formed by a conventional sputtering film formation method is reduced in thickness as far as possible, for example down to a film thickness of 100 Å or less, the durability of the formed film may be unsatisfactory.

Accordingly, methods that employ sputter method and plasma CVD method are becoming widespread as methods capable of forming carbon protective films having higher strengths than those obtainable using sputtering methods.

However, in those methods where the carbon protective film is formed using sputter method and plasma CVD method, inside the film formation apparatus, carbon is not only formed on the surface of the substrate, but also accumulates on the surfaces of the carrier that supports the substrate. When the amount of this type of carbon accumulated on exposed surfaces increases, factors such as internal stress cause the film formed from the accumulated carbon to peel away from the exposed surface. If the particles of carbon generated as a result of this type of peeling adhere to the substrate surface, then protrusions tend to be formed on the carbon protective film, resulting in localized film thickness abnormalities that can cause product defects. Particularly in those cases where the carbon protective film is formed using a plasma CVD method, the resulting film composed of carbon has a higher degree of hardness and higher internal stress than a carbon protective film formed using a conventional sputtering method, and therefore the amount of generated carbon particles is large, and the type of film thickness abnormalities mentioned above tend to be particularly problematic.

Methods of removing a carbon film accumulated on the surface of a substrate-supporting carrier by ashing the carbon film using an oxygen plasma have been proposed to prevent the generation of the types of particles described above (for example, see Japanese Unexamined Patent Application, First Publication No. Hei 11-229150, and Japanese Unexamined Patent Application, First Publication No. 2002-025047). Further, a treatment for suppressing peeling of accumulated material from an electrode by roughening the surface of the carrier has been used to prevent the peeling of an accumulated film from the surface of a substrate-supporting carrier (for example, see Japanese Unexamined Patent Application, First Publication No. 2006-173343).

Recently, there have been considerable demands for further improvements in the cleanliness of the surface of magnetic recording media in order to enable further improvements in the recording density of the magnetic recording media. However, the methods described above alone are not able to satisfactorily reduce the generation of particles, because although thorough ashing occurs in those regions such as the edges of the carrier where the plasma is readily concentrated, satisfactory ashing tends to be unobtainable in regions where the plasma is less readily concentrated, such as the flat surfaces of the carrier. Accordingly, reducing magnetic recording media defects caused by carbon protective film particles is currently a significant problem.

As described above, one of the causes of particle generation from the carbon protective film is the fact that improving the cleanliness of the carrier that supports the substrate is very difficult, and methods of improving this level of cleanliness have been keenly sought.

Further, according to research conducted by the inventors of the present invention, the carbon film accumulated on the carrier surfaces is not completely removed by the ashing treatment described above, and residues tend to remain on the carrier, mainly on the flat surfaces of the carrier. These residues are transported into other film formation chambers together with the carrier, and have also been confirmed as a component of the outgas emitted inside the vacuum chamber. In order to further increase the recording density of a magnetic recording medium while achieving a stable level of product stability, the emission within the vacuum chamber of components other than the intentionally used process gases must be avoided, and improvements in this area are also required.

DISCLOSURE OF INVENTION

Problems to be Solved by the Invention

The present invention takes the above circumstances into consideration, with an object of providing a manufacturing method in which, during formation of a carbon protective film on a substrate using a CVD method, by effectively reducing the carbon film accumulated on the carrier that supports the substrate, suppressing the generation of particles that accompany peeling of the accumulated film, and suppressing the emission of outgas for which the production source is the accumulated carbon film on the carrier surface, a magnetic recording medium can be manufactured that has a high recording density, excellent recording and reproduction characteristics, and stable quality.

Means to Solve the Problems

As a result of intensive and concerted research aimed at achieving the above object, the inventors of the present invention discovered that a residual carbon film that had accumulated on a substrate-supporting carrier during formation of a carbon protective film on a substrate was able to be removed efficiently by providing an ashing step using an oxygen plasma, with the ashing step conducted following the step of removing the magnetic recording medium from the carrier following film formation, but prior to the step of mounting a substrate for film formation on the carrier, and also discovered that by using a magnetic field to cause plasma convergence within the oxygen plasma, and in particular by forming a rotating magnetic field in the vicinity of the region where the accumulation of carbon on the carrier is great, the ashing efficiency could be improved dramatically. Furthermore, the inventors also discovered that by using a magnetron sputtering method to form a metal film on the carrier surface following ashing, thereby coating any residual accumulated carbon, the emission of outgas from the carrier could be even more effectively suppressed, and they were therefore able to complete the present invention. In other words, the present invention relates to the aspects described below.

(1) A method for manufacturing a magnetic recording medium by mounting a substrate for film formation on a carrier, sequentially transporting said substrate into a plurality of connected chambers, and forming at least a magnetic film and a carbon protective film on said substrate for film formation within said chambers, wherein said method comprises a step of conducting ashing to remove an accumulated carbon protective film adhered to a carrier surface, which is performed following a step of removing a magnetic recording medium from said carrier following film formation, but prior to a step of mounting a substrate for film formation on said carrier.

(2) The method for manufacturing a magnetic recording medium according to (1) above, further comprising a step of forming a metal film on a carrier surface, which is performed following said step of conducting ashing to remove an accumulated carbon protective film adhered to a carrier surface, but prior to a step of mounting a substrate for film formation on said carrier.

(3) The method for manufacturing a magnetic recording medium according to (2) above, wherein said step of conducting ashing to remove an accumulated carbon protective film adhered to a carrier surface and said step of forming a metal film on a carrier surface are conducted within a single chamber.

(4) The method for manufacturing a magnetic recording medium according to any one of (1) to (3) above, wherein said ashing to remove an accumulated carbon protective film adhered to a carrier surface is conducted using a plasma comprising oxygen.

(5) The method for manufacturing a magnetic recording medium according to (4) above, wherein an external magnetic field is applied to said plasma comprising oxygen, thereby concentrating a plasma causing said ashing at a carrier surface.

(6) The method for manufacturing a magnetic recording medium according to (5) above, wherein said magnetic field applied to said plasma during said ashing step is a rotating magnetic field that sweeps out a helical trajectory.

(7) The method for manufacturing a magnetic recording medium according to any one of (2) to (6) above, wherein said step of forming a metal film on a carrier surface is conducted by a magnetron discharge sputtering method that uses rotating magnetic field assistance.

(8) The method for manufacturing a magnetic recording medium according to any one of (2) to (7) above, wherein said metal film formed on a carrier surface is a metal material having low oxidative reactivity.

(9) The method for manufacturing a magnetic recording medium according to (8) above, wherein said metal material having low oxidative reactivity comprises one element selected from the group consisting of Ru, Au, Pd and Pt.

(10) An apparatus for manufacturing a magnetic recording medium, having a plurality of connected chambers, and in which a plurality of thin films are laminated on a substrate for film formation by sequentially transporting said substrate to each of said chambers using a carrier and then forming a thin film on said substrate for film formation, wherein said apparatus comprises a chamber for removing a magnetic recording medium from a carrier following film formation, and a chamber for mounting a substrate for film formation on a carrier from which a magnetic recording medium has been removed, and also comprises, between said chambers, a chamber for conducting ashing to remove an accumulated carbon protective film adhered to a carrier surface.

(11) The apparatus for manufacturing a magnetic recording medium according to (10) above, further comprising a chamber for forming a metal film on a carrier surface between said chamber for conducting ashing to remove an accumulated carbon protective film adhered to a carrier surface and said chamber for mounting a substrate for film formation on a carrier.

(12) The apparatus for manufacturing a magnetic recording medium according to (11) above, wherein said chamber for conducting ashing to remove an accumulated carbon protective film adhered to a carrier surface and said chamber for forming a metal film on a carrier surface are a single chamber.

Effect of the Invention

By using the method for manufacturing a magnetic recording medium of the present invention, which employs ashing of the accumulated carbon film on the substrate-supporting carrier and a cleanliness retention technique that uses a metal film coating, when a carbon protective film is formed on both surfaces of a magnetic recording medium, the carbon film that accumulates on the carrier surface is able to be effectively removed by ashing, meaning the problems caused when the film detaches to form particles that subsequently adhere to the substrate can be effectively suppressed.

Furthermore, by coating the residual film that remains on the carrier surface following ashing with a metal film, outgas from the carrier can be suppressed.

DESCRIPTION OF THE REFERENCE SYMBOLS

Figure 1:
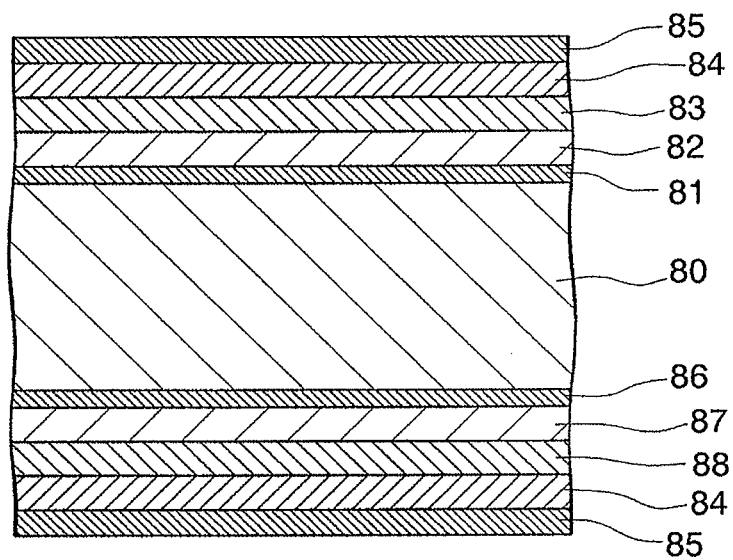
FIG. 1 is a schematic longitudinal sectional view illustrating one example of a magnetic recording medium manufactured using the method for manufacturing a magnetic recording medium according to the present invention.

1: Substrate cassette-transferring robot mount
2: Substrate supply robot chamber
3: Substrate cassette-transferring robot
3A: Carrier ashing chamber
3B: Carrier metal film formation chamber
4, 7, 14, 17: Corner chamber for rotating carrier
5, 6, 8 to 13, 15, 16: Sputtering chamber or substrate heating chamber
18 to 20: Protective film formation chamber
22: Substrate removal robot chamber
23, 24: Substrate for film formation (non-magnetic substrate)
25: Carrier
26: Support base
27: Substrate mount
28: Plate
29: Circular through-hole
30: Support member
34: Substrate supply robot
49: Substrate removal robot
52: Substrate installation chamber
54: Substrate removal chamber
80: Non-magnetic substrate
81: Seed layer
82: Undercoat film
83: Magnetic recording film
84: Protective film
85: Lubricant layer 501: Ashing device, metal film coating device
502: Chamber
503: Substrate-supporting carrier
504: Magnet
505: Target material
506: Exhaust volume control valve
507: Direct current power source
508: High-frequency power source
509: Gas inlet tube
510: Drive device
511: Magnetic field

BEST MODE FOR CARRYING OUT THE INVENTION

Embodiments of the ashing of the accumulated carbon film on the carrier and the improvement in carrier cleanliness produced by forming a metal film coating on the carrier in accordance with the present invention are described below.

First is a description of a magnetic recording medium that represents one example of the thin film laminate produced using the method for manufacturing a magnetic recording medium according to the present invention.

FIG. 1 is a schematic longitudinal sectional view illustrating one example of a magnetic recording medium (thin film laminate) manufactured using the method for manufacturing a magnetic recording medium according to the present invention.

As illustrated in FIG. 1, this magnetic recording medium includes a non-magnetic substrate 80, and a seed layer 81, an undercoat film 82, a magnetic recording film 83, a protective film 84 and a lubricant layer 85 laminated sequentially on both surfaces or one surface of the non-magnetic substrate 80.

Examples of materials that may be used for the non-magnetic substrate 80 include the types of Al alloy substrates having a NiP plating film formed thereon (hereafter referred to as NiP-plated Al substrates) typically used as substrates for magnetic recording media, as well as glass substrates, ceramic substrates, flexible resin substrates, and substrates prepared by coating one of these non-magnetic substrates with NiP using either a plating method or a sputtering method.

Further, the surface of the non-magnetic substrate 80 may be subjected to a texturing treatment for the purposes of achieving more favorable electromagnetic conversion characteristics, imparting the substrate with in-plane magnetic anisotropy to improve the heat fluctuation characteristics, and/or removing any polishing marks.

The seed layer (lower undercoat layer) 81 formed on the non-magnetic substrate 80 controls the crystal orientation of the film formed directly thereon. Examples of the material used in forming the seed layer 81 include Ti, TiCr, Hf, Pt, Pd, NiFe, NiFeMo, NiFeCr, NiAl, NiTa and NiNb, which may be selected and used in accordance with the film formed directly on the seed layer.

Furthermore, the seed layer 81 need not necessarily be formed from only a single layer, and if required, may be formed as a multilayer structure by laminating a plurality of films having either the same composition or different compositions.

Conventional non-magnetic undercoat films may be used as the undercoat film 82, including single element films of Cr, Ti, Si, Ta or W or the like, or alloy films that also include other elements, provided the crystallinity is not impaired. In terms of the relationship with the magnetic recording film 83 described below, the undercoat film 82 is preferably either composed solely of Cr, or formed from an alloy of Cr containing one or more other elements selected from among Mo, W, V and Ti. In some cases, depending on the type of the non-magnetic substrate 80, laminating a film of NiAl as the undercoat film 82 may yield a dramatic improvement in the SNR, and may therefore be desirable.

There are no particular limitations on the thickness of the undercoat film 82, provided the desired coercive force can be obtained, although the thickness is preferably within a range from 5 to 40 nm, and is more preferably from 10 to 30 nm. If the thickness of the undercoat film 82 becomes overly thin, then the crystal orientation of either the magnetic recording film 83 formed on the undercoat film 82, or if employed, the non-magnetic intermediate film formed between the undercoat film 82 and the magnetic recording film 83, tends to deteriorate, causing an undesirable decrease in the SNR. In contrast, if the thickness of the undercoat film 82 is too large, then the particle size of the particles within the undercoat film 82 tends to increase, resulting in an accompanying increase in the particle size within the magnetic recording film 83 or the non-magnetic intermediate film formed on the undercoat film 82, which causes an undesirable decrease in the SNR.

Furthermore, the undercoat film 82 need not necessarily be formed from only a single layer, and if required, may be formed as a multilayer structure by laminating a plurality of films having either the same composition or different compositions.

There are no particular limitations on the magnetic recording film 83, provided it is a magnetic film capable of yielding the desired coercive force, although by using a Co alloy layer represented by a formula $CO_aCr_bPt_cTa_dZr_eCu_fNi_g$ (wherein a, b, c, d, e, f and g indicate the composition ratio, and respectively represent b: 16 to 25 at %, c: 0 to 10 at %, d: 1 to 7 at %, e: 0 to 4 at %, f: 0 to 3 at %, g: 0 to 10 at %, and a: the remainder) the magnetic anisotropy can be increased, enabling the coercive force to be further improved.

In the magnetic recording medium of this embodiment, the protective film 84 is formed on the magnetic recording film 83 to prevent scratching of the magnetic recording film 83 caused by contact between the head and the surface of the medium. Conventional materials may be used for the protective film 84, and examples include single component films formed from C, $SiO_2$ or $ZrO_2$ or the like, or films containing these materials as the main component and also containing other added elements.

The protective film 84 may be formed using a method such as sputtering method, an ion beam method or plasma CVD method or the like.

The thickness of the protective film 84 is typically within a range from 2 to 20 nm. Setting the thickness of the protective film 84 within a range from 2 to 9 nm is preferred in terms of reducing spacing loss.

The lubricant layer 85 is formed on the surface of the protective film 84. Examples of materials that may be used as the lubricant include fluorine-based liquid lubricants such as perfluoropolyethers (PFPE), and solid lubricants such as fatty acids. Conventional methods may be used for applying the lubricant, including dipping methods and spin coating methods.

Next is a description of a method for manufacturing the magnetic recording medium that represents one example of a thin film laminate of the present invention.

First is a description of the apparatus for manufacturing a magnetic recording medium that is used in the method for manufacturing a magnetic recording medium according to the present invention.

Figure 2:
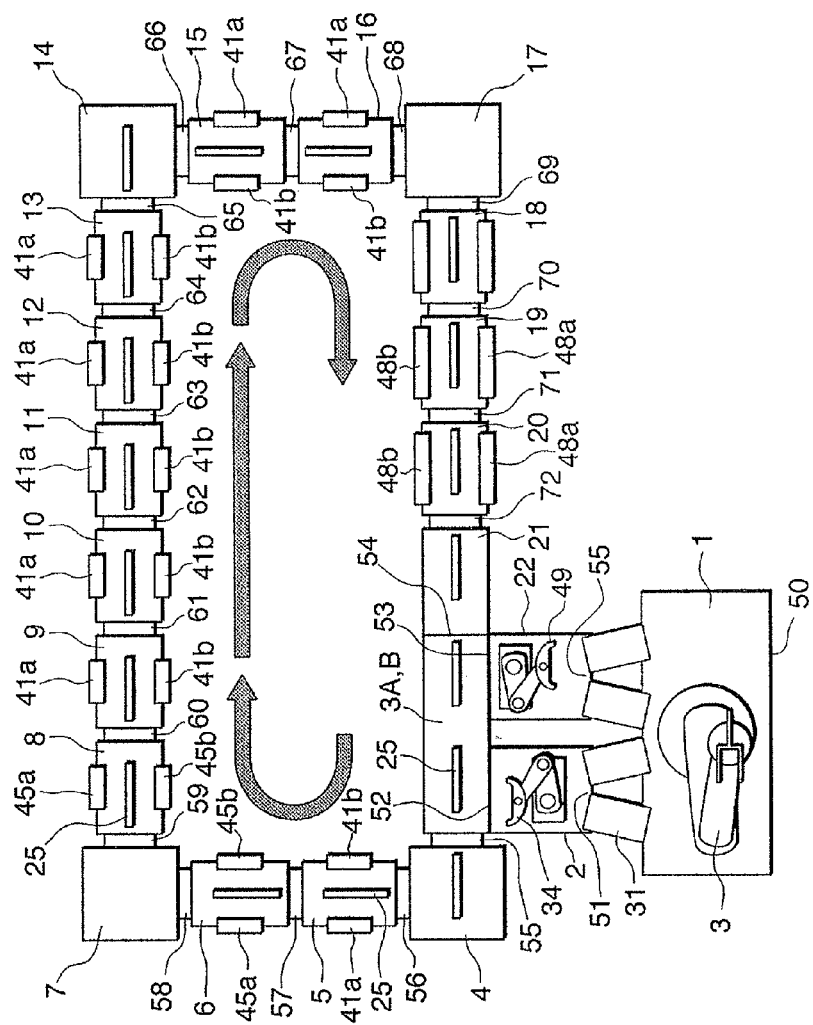
FIG. 2 is a schematic illustration of an apparatus for manufacturing a magnetic recording medium according to the present invention.
Figure 3:
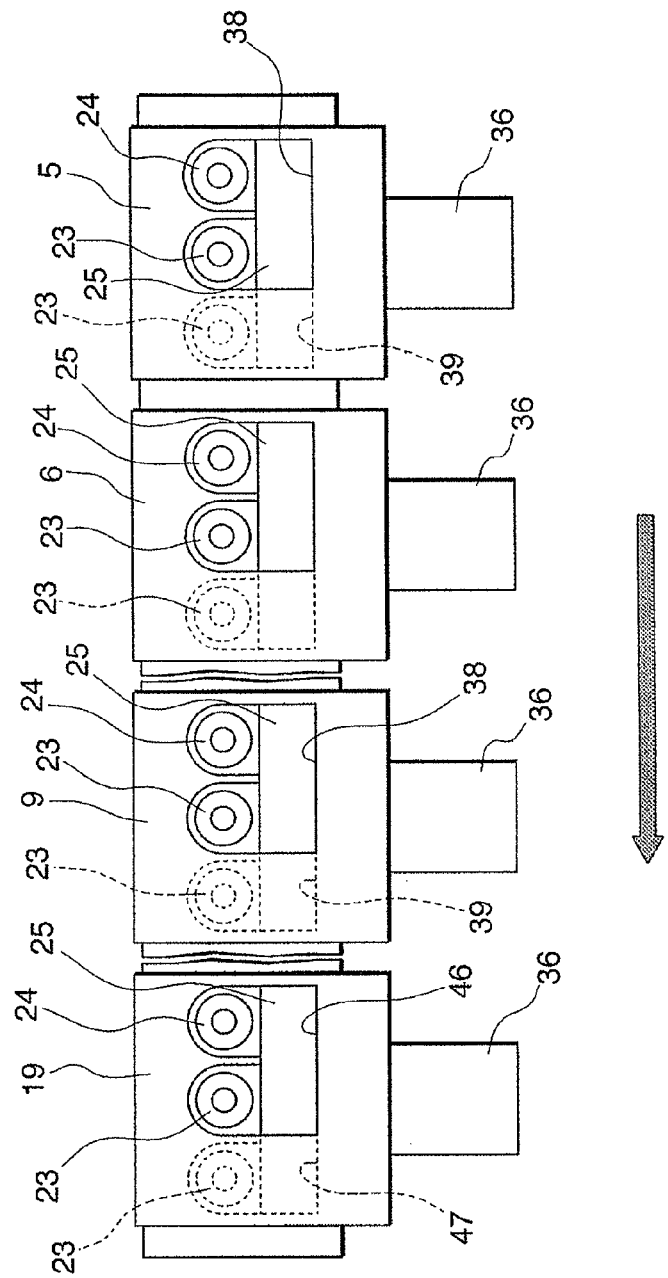
FIG. 3 is a schematic illustration of a sputtering chamber within an apparatus for manufacturing a magnetic recording medium according to the present invention.
Figure 4:
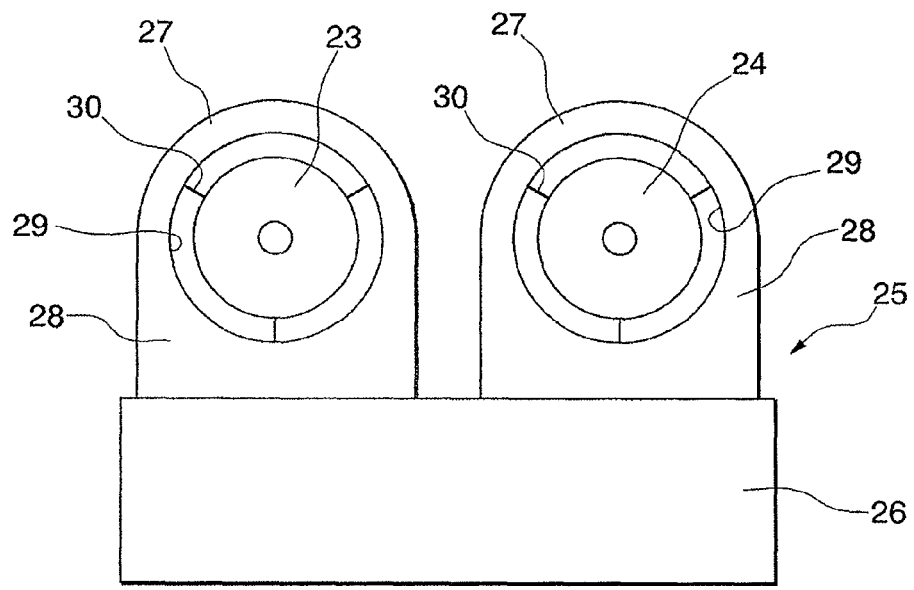
FIG. 4 is a side view illustrating a carrier within an apparatus for manufacturing a magnetic recording medium according to the present invention.

FIG. 2 is a schematic diagram illustrating one example of the apparatus for manufacturing a magnetic recording medium according to the present invention, FIG. 3 is a schematic illustration of a sputtering chamber within the apparatus for manufacturing a magnetic recording medium according to the present invention, and FIG. 4 is a side view illustrating a carrier within the apparatus for manufacturing a magnetic recording medium according to the present invention. In FIG. 3, the carrier indicated by the solid lines represents the state when the carrier is stopped at a first film formation position, whereas the carrier indicated by the dashed lines represents the state when the carrier is stopped at a second film formation position. In other words, in the sputtering chambers illustrated for this example, two targets are positioned opposing the substrate within the chamber, and therefore film formation is first conducted onto the substrate on the left side of the carrier with the carrier stopped at the first film formation position, the carrier is subsequently moved to the position indicated by the dashed lines, and film formation is then conducted onto the substrate on the right side of the carrier with the carrier stopped at the second film formation position. In those cases where four targets are positioned opposing the substrates within the chamber, this type of movement of the carrier becomes unnecessary, and film formation onto the substrates supported on the left and right sides of the carrier can be conducted simultaneously.

As illustrated in FIG. 2, this magnetic recording medium manufacturing apparatus includes a substrate cassette-transferring robot mount 1, a substrate cassette-transferring robot 3, a substrate supply robot chamber 2, a substrate supply robot 34, a substrate installation chamber 52, corner chambers 4, 7, 14 and 17 for rotating the carrier, sputtering chambers and substrate heating chambers 5, 6, 8 to 13, 15 and 16, protective film formation chambers 18 to 20, a substrate removal chamber 54, a substrate removal robot chamber 22, a substrate removal robot 49, a carrier ashing chamber 3A, a carrier metal film formation chamber 3B, and a plurality of carriers 25 with a plurality of substrates for film formation (non-magnetic substrates) 23 and 24 mounted thereon. In the apparatus of this embodiment, the carrier ashing chamber 3A and the carrier metal film formation chamber 3B utilize the same chamber.

A vacuum pump is connected to each of these chambers 2, 52, 4 to 20, 54, 3A and 3B, and each of the carriers 25 is transported sequentially into each of the chambers, the insides of which are maintained in a reduced pressure state by operation of the vacuum pumps. By forming thin films (such as the seed layer 81, the undercoat film 82, the magnetic recording film 83 and the protective film 84) on both surfaces of the mounted film formation substrates 23 and 24 inside each of the film formation chambers, a magnetic recording medium that represents one example of a thin film laminate can be obtained.

For example, the magnetic recording medium manufacturing apparatus of this embodiment can be configured as an inline type film formation apparatus. In the magnetic recording medium manufacturing apparatus of this embodiment, the seed layer 81, the undercoat film 82, the magnetic recording film 83 and the protective film 84 may be formed with a two-layer configuration, a two-layer configuration, a four-layer configuration, and a two-layer configuration respectively.

As illustrated in FIG. 4, the carrier 25 includes a support base 26 and a plurality of substrate mounts 27 (two in the case of this embodiment) provided on the upper surface of the support base 26.

Each of the substrate mounts 27 is composed of a plate 28 of substantially the same thickness as the substrates for film formation (the non-magnetic substrates) 23 and 24, in which is formed a circular through hole 29 having a slightly larger diameter than the outer periphery of the film formation substrates 23 and 24, with a plurality of support members 30 extending from the periphery of the through hole 29 towards the interior of the through hole 29. The film formation substrates 23 and 24 are fitted inside the through holes 29 of the substrate mounts 27, and the edges of the substrates engage with the support members 30, thereby supporting and holding the film formation substrates 23 and 24. These substrate mounts 27 are provided in alignment on the upper surface of the support base 26 so that the main surfaces of the two mounted film formation substrates 23 and 24 are not only substantially orthogonal relative to the upper surface of the support base 26, but are also positioned within substantially the same plane. In the following description, the two film formation substrates 23 and 24 mounted on the substrate mounts 27 are referred to as the first film formation substrate 23 and the second film formation substrate 24 respectively.

The substrate cassette-transferring robot 3 supplies the film formation substrates 23 and 24 from a cassette in which the substrates are housed to the substrate supply robot chamber 2, and also extracts magnetic disks (namely, the film formation substrates 23 and 24 with each of the films 81 to 84 formed thereon) that have been removed from the substrate removal robot chamber 22. These substrate supply and removal robot chambers 2, 22 each have an external opening on one side of the chamber, and doors 51 and 55 that open and close the opening.

Further, neighboring walls between each of the chambers 2, 52, 4 to 20, 54, 3A and 3B are mutually interconnected, and a gate valve is provided within the connection between each pair of chambers, so that when these gate valves are closed, the inside of each chamber is an independently sealed space.

The corner chambers 4, 7, 14 and 17 are chambers used for altering the moving direction of the carrier 25, and each of these chambers is provided with a mechanism, not shown in the drawing, for rotating the carrier and transferring it to the next chamber.

The protective film formation chambers 18 to 20 are chambers for forming a protective film, using a CVD method or the like, on the surface of the outermost layer formed on the first film formation substrate 23 and the second film formation substrate 24. A reactive gas supply tube and a vacuum pump, which are not illustrated in the drawing, are connected to each of the protective film formation chambers.

The reactive gas supply tube is provided with a valve, the opening and closing of which is controlled by a control mechanism not shown in the drawing, and a gate valve for the vacuum pump, the opening and closing of which is controlled by a control device not shown in the drawing, is provided between the vacuum pump and the protective film formation chamber. By controlling the opening and closing of this valve and pump gate valve, the supply of gas from the sputtering gas supply tube, the pressure inside the protective film formation chamber, and the exhausting of gas from the chamber can be controlled.

When film formation is conducted within the protective film formation chamber using a CVD method, a reactive gas is supplied to the chamber, a high-frequency voltage is applied between an electrode and the film formation substrate to generate a discharge between the two, and this discharge causes the reactive gas introduced into the chamber to adopt a plasma state. The active radical and ion reactants generated within the plasma are formed on the surface of the outermost layer formed on the film formation substrate 23, thus forming a protective film.

In the substrate removal chamber 54, the first film formation substrate 23 and the second film formation substrate 24 mounted on the carrier 25 are removed using the robot 49. Subsequently, the carrier 25 is transported into the carrier ashing chamber 3A and the carrier metal film formation chamber 3B. In this embodiment, the carrier ashing chamber 3A and the carrier metal film formation chamber 3B utilize the same chamber.

The ashing of the accumulated carbon film on the carrier according to the present embodiment is conducted by first removing the substrates having the magnetic film and protective film and the like formed thereon from the substrate-supporting carrier under vacuum, subsequently positioning only the carrier, which was accumulated with carbon film at the same time as the substrate, inside the chamber, and then applying high-frequency electrical power to an arbitrary portion of the carrier. If oxygen gas is then simultaneously introduced into the chamber from an arbitrary location, the oxygen gas undergoes decomposition with the carrier itself acting as an electrode, resulting in the generation of an oxygen plasma. When the thus generated oxygen plasma contacts the accumulated carbon film on the carrier surface, the carbon is decomposed and removed as gaseous $CO$ and $CO_2$.

When conducting ashing of the carbon film, it is already well known that the generated plasma, because of its nature, tends to be concentrated near sharp edges or in the vicinity of the position where the high-frequency electrical power is applied. As a result, the carrier undergoes thorough ashing along the edges of the carrier and in the vicinity of the position where the high-frequency electrical power is applied, but uniform ashing of the entire carrier including the flat surfaces is difficult.

In order to address this problem, in the present invention, flow control of the plasma is achieved using a magnetic field, with the aim of enabling the plasma to be concentrated uniformly within the vicinity of the substrate mounting regions of the carrier. Possible techniques for forming the magnetic field include installing a fixed permanent magnet or electromagnet either inside or outside the chamber, thereby generating the type of magnetic field illustrated in the drawings. However, use of a fixed magnet narrows the region in which the plasma is concentrated, making it difficult to achieve favorable ashing of the whole carrier across a wide area.

In order to resolve the problem described above, a rotating magnetic field is preferably formed in the plasma. As a result of this rotating magnetic field, the plasma that effects the ashing is imparted with kinetic energy, and flows across the carrier in a diagonal direction while sweeping out a helical trajectory.

The oxygen plasma that contacts the carbon on the carrier surface initiates a reaction with the carbon to form $CO$ and $CO_2$, and therefore has the effect of removing the carbon from the carrier surface by releasing these gases into the chamber. The oxygen plasma not involved in the reaction returns to the helical magnetic field trajectory, and contributes to the ashing process when it next makes contact with the carrier. Accordingly, using a rotating magnetic field causes a dramatic increase in the number of chances for contact between the oxygen plasma and the carrier surface, resulting in an improvement in the carbon removal rate from the carrier surface per unit of time.

In the present invention, the rotating magnet used for forming the abovementioned rotating magnetic field may be positioned either inside or outside the ashing chamber, but because positioning a rotating body inside a vacuum environment, and applying a rotational drive force from externally to an internal rotating body are difficult and not preferable in terms of maintaining the degree of vacuum and the cleanliness, the rotating magnet is preferably positioned outside the chamber. The rotational speed of the magnet used for forming the rotating magnetic field is typically within a range from 60 to 800 rpm, and is preferably from 300 to 600 rpm.

Furthermore, because the carbon film accumulates on both surfaces of the carrier, rotating magnets must be installed in opposing positions with the carrier sandwiched therebetween. Moreover, if the same poles of the opposing magnetic fields are synchronized with the same phase, then repulsion between the magnetic fields causes the plasma flow to lose uniformity, and therefore the matching poles are preferably in an asynchronous antiphase state.

In the present invention, basically, pure oxygen gas is used when conducting the treatment described above, although using a mixed gas of argon (Ar) gas and oxygen gas as the treatment gas is also possible. In terms of the pressure inside the chamber during the treatment, although the treatment can be conducted at any pressure within a range from 1.0 to 10 Pa, if the pressure is too low, then the oxygen plasma discharge tends to become unstable, whereas if the pressure is too high, then considerable time is required to expel the residual oxygen gas from the chamber following completion of the discharge, and consequently the pressure is preferably within a range from 2 to 5 Pa. The flow rate of the treatment gas is preferably set within a range from 100 to 500 sccm so as to satisfy the pressure range described above. Regulation of the pressure is typically performed using an exhaust volume control valve, which is fitted to the chamber but not shown in the drawings.

In the present invention, during the ashing treatment described above, high-frequency electrical power is applied to the carrier itself, thereby generating an oxygen plasma by decomposing the treatment gas containing oxygen that has been introduced into the chamber and exists in the vicinity of the carrier. The high-frequency electrical power applied at this time is electrical power having a frequency within a range from 13.56 to 60 MHz, and if due consideration is given to ease of handling and the specifications of the equipment required, a frequency of 13.56 MHz is preferred. Further, the high-frequency electrical power introduced into the carrier is preferably within a range from 100 to 500 W. Moreover, because heating of the carrier itself accompanies the application of the above high-frequency electrical power, a treatment time of not more than 10 seconds per ashing treatment is preferred, and if productivity is also considered, then a treatment time of not more than 3 seconds is more desirable.

Next is a description of a metal film coating on the carrier surface according to the present embodiment. Even when the carbon accumulated on the carrier is subjected to ashing using the method disclosed in the present invention, the accumulated film may not be able to be completely removed in some cases, such as when the surface of the carrier has been subjected to surface roughening, or when the treatment time has been reduced in consideration of achieving favorable mass productivity for the magnetic recording medium. Accordingly, the carbon that has not been completely removed by the ashing treatment remains on the carrier as a residue that has been converted to an activated state by the oxygen plasma, and it has been confirmed that when this activated carbon residue is transferred to another film formation chamber together with the carrier, the residue is released into the chamber as an outgas containing CO and/or $CO_2$.

In an inline type film formation apparatus, following completion of the ashing step, a new substrate with no films formed thereon is supplied to the carrier, and either films of those materials required for forming the magnetic recording medium are formed sequentially on the substrate in the subsequent chambers, or the substrate is subjected to a heat treatment. In the former case, when the film formation of the required materials is conducted by magnetron discharge, because the outgas released into the chamber causes a deterioration in the purity of the process gas (typically pure Ar) required for the discharge, the quality of the formed film itself also tends to deteriorate. Further, in the latter case, because the carrier itself is also exposed to heating during the substrate heat treatment, the release of the outgas containing CO and $CO_2$ from the carrier surface is accelerated. This outgas released from the carrier adsorbs to the substrate surface prior to film formation, causing a deterioration in the magnetostatic characteristics and the electromagnetic conversion characteristics of the magnetic recording medium.

In the present invention, in order to resolve this problem, a step of forming a metal film on the carrier surface is preferably provided following the step of conducting ashing to remove the accumulated carbon protective film adhered to the carrier surface, but prior to a step of mounting a substrate for film formation on the carrier. Providing this type of step has been confirmed to reduce the emission of outgas from the carrier.

In the present invention, the metal material used for coating the carrier in order to block the release of outgas may be either a magnetic material or a non-magnetic material, although if a film of a magnetic material is formed, then the carrier itself becomes magnetic, and therefore a non-magnetic material is preferably used. Furthermore, the material itself may be composed of either a single metal element or a metal alloy containing a plurality of elements, although an alloy composition that includes metal oxides is undesirable as it may result in the release of gas from the oxides. Moreover, the use of a metal material that exhibits a high level of oxidative reactivity is also undesirable.

In the present invention, when forming the film of the metal material on the carrier surface, if the film is too thin, then the suppression effect on the outgas is minimal, whereas if the film is too thick, the total amount of the metal film accumulated on the carrier increases significantly, which may cause peeling of the film from the carrier, and also increases the frequency with which the carrier must be replaced. For these reasons, the film thickness is preferably within a range from 30 to 200 Å (3 to 20 nm), and is more preferably within a range from 50 to 100 Å (5 to 10 nm). Moreover, the film is preferably formed over the entire carrier surface, without installing the types of shields that are widely used for restricting the film formation region.

In the present invention, the ashing treatment of carbon adhered to the carrier and the coating treatment of a metal film on the carrier surface may be either conducted in different chambers, or conducted as a series of processes within the same chamber. In order to improve the effect of the treatments, the ashing treatment and the metal film coating treatment are preferably conducted in that order, within the same chamber.

In those cases where the treatments are conducted within the same chamber, because the surface of the target material for the metal material coating film is exposed to the oxygen plasma during the preceding ashing treatment, if a metal material having a high oxidative reactivity is used, then particular care needs to be taken to avoid oxidation of the target material itself. If the surface of the target material oxidizes, then not only does the initiation of the discharge become unstable during the coating treatment of the carrier surface conducted following ashing, but the film formation rate per unit of time also decreases dramatically, making it difficult to achieve the desired coating film thickness, and meaning a satisfactory suppression of outgas from the carrier is unachievable. Moreover, the oxidized material may itself form a film on the carrier surface, which can cause adverse effects due to the release of oxygen from the oxide.

Figure 5:
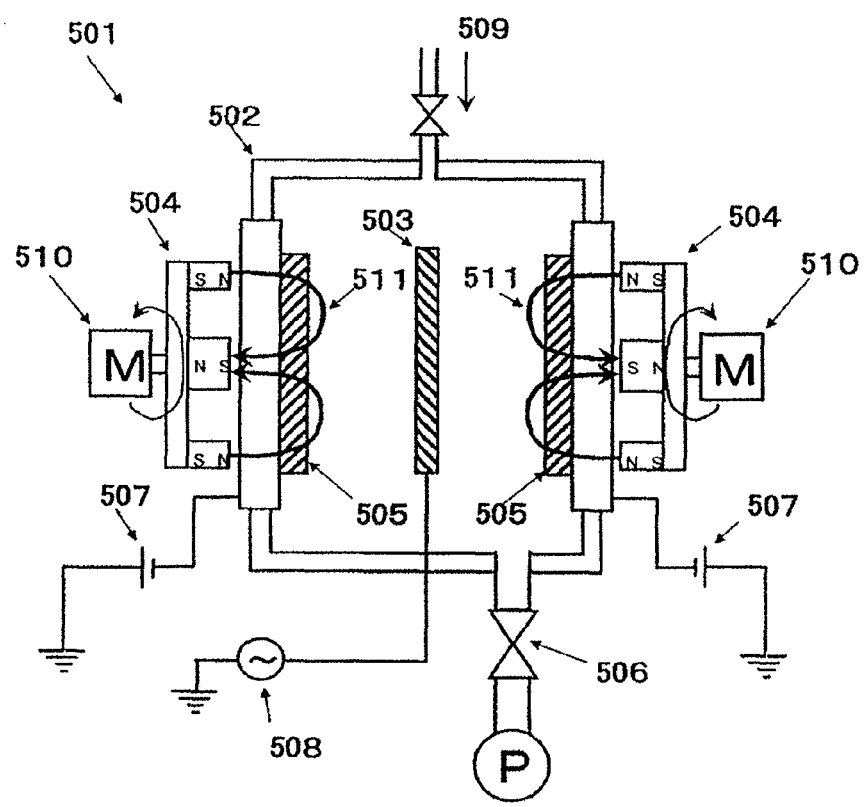
FIG. 5 is a schematic illustration of an ashing treatment device and a metal film coating device according to the present invention.

An apparatus 501 illustrated in FIG. 5 represents one example of the apparatus used for conducting the carrier ashing and the formation of a metal film coating on the carrier in accordance with the present invention. This apparatus 501 is used for performing ashing of the carrier and for coating the surface of the carrier with a metal film, and a chamber 502 includes a carrier 503 for supporting a substrate within a state of vacuum. At this point, no substrate is mounted on the carrier 503. Magnets 504 for forming a rotating magnetic field are installed outside the chamber, and are each rotated at an arbitrary rate of rotation using a drive device 510. A metal target material 505 that acts as the material used in forming the metal film coating on the carrier is installed inside the chamber, and a magnetic field 511 from the magnet 504 penetrates into the chamber 502 and is formed on the surface of the target material 505. The chamber 502 is provided with an exhaust port, and an exhaust pump is used to extract and remove gases from inside the chamber 502. An exhaust volume control valve 506 that is controlled by a control device not shown in the drawing can be used to set the exhaust volume at a desired level. High-frequency electrical power is applied to the carrier 503 inside the chamber 502 using a high-frequency power source 508. A direct current is applied to the target material 505 from a direct current power source 507. A gas inlet tube 509 is provided in the chamber 502 to enable the treatment gas to be introduced into the chamber 502.

The power source 508 supplies the electrical power that, with the carrier 503 acting as an electrode, generates the plasma within the oxygen-containing gas, during the carrier ashing of the present embodiment. A high-frequency power source or a microwave source can be used as this power source 508. The capacity of the power source 508 is preferably sufficient to supply an electrical power of 50 to 1,000 W to the carrier during ashing discharge.

The power source 507 supplies the electrical power that causes discharge of the metal target material 505 within the gas composed mainly of Ar, during the coating of the carrier surface in accordance with the present embodiment. The power source 507 is preferably a DC power source or a pulsed DC power source. Further, the capacity of the power source 507 is preferably sufficient to supply an electrical power of 50 to 1,500 W.

The gas 509 introduced into the chamber during the ashing treatment is preferably a gas containing oxygen as the main component. A mixed gas of argon and oxygen may also be used, but because the argon gas makes no contribution to the ashing treatment that decomposes and removes the accumulated carbon film in the form of CO and $CO_2$, the use of pure oxygen gas is preferred. Furthermore, gases other than argon or oxygen, such as nitrogen gas, can adsorb to the carrier, lowering the degree of vacuum inside the chamber, and are therefore undesirable. For the above reasons, the oxygen gas used for the ashing treatment is preferably a high-purity oxygen gas having a purity of not less than 99.9%.

The gas 509 introduced into the chamber during the carrier coating treatment is preferably a gas containing argon as the main component. A mixed gas containing oxygen or nitrogen mixed with argon may also be used, but using this type of mixed gas tends to invite a lowering in the degree of vacuum caused by gas adsorption on the carrier, and is therefore undesirable. Further, when generating the discharge from the metal target material used for forming the coating film, it is necessary to ensure that the film formation rate per unit of time is maintained at the maximum possible level, and therefore the use of an argon gas having a purity of not less than 99.9% is fundamentally preferred.

When the present invention is realized using the apparatus illustrated in FIG. 5, the gas used for the ashing treatment and the gas used for the formation of the metal film coating may be introduced into the chamber through the same inlet tube, but may also be introduced through separate inlet tubes.

The ashing treatment of the present embodiment is initiated by housing the carrier 503, with no substrate mounted thereon, inside the chamber 502 that is held in a vacuum state of not more than $1 \times 10^{-4}$ Pa, and then closing the gate valve on the chamber. Subsequently, oxygen gas is introduced from the gas inlet tube 509, the exhaust volume control valve 506 is used to regulate the exhaust volume and hold the pressure inside the chamber within a range from 2 to 5 Pa, and a high-frequency electrical power is then applied to the carrier 503 from the power source 508. From a practical perspective, the high-frequency electrical power applied preferably has a frequency of 13.56 MHz, has a power level within a range from 100 to 1,000 W, and if due consideration is given to the amount of ashing per unit of time and the increase in the temperature of the carrier itself as a result of applying the high-frequency power, preferably has a power level within a range from 300 to 500 W. Moreover, in terms of ensuring applicability with practical industrial production, the ashing treatment is preferably completed within a time of approximately 2 to 5 seconds. The oxygen gas introduced into the chamber undergoes ionization under the influence of the high-frequency electrical power applied to the carrier 503, and decomposes to form an oxygen plasma. At this time, the plasma is mainly concentrated at the position where the high-frequency electrical power is introduced and at the sharp edges of the carrier, resulting in unsatisfactory ashing of the flat surfaces of the carrier, and therefore the magnets 504 are used to focus the plasma. Moreover, in order to increase the amount of ashing per unit of time, the magnets 504 are preferably rotated using rotational motors 510, thereby forming rotating magnetic fields. By forming this type of rotating magnetic field, the plasma that effects the ashing is imparted with kinetic energy, causing the plasma to flow across the carrier in a diagonal direction while sweeping out a helical trajectory. The oxygen plasma that contacts the carbon on the carrier surface initiates a reaction with the carbon to form CO and $CO_2$, and therefore has the effect of removing the carbon from the carrier surface by releasing CO and $CO_2$ into the chamber. At this time, the oxygen plasma not involved in the reaction returns to the helical magnetic field trajectory, and contributes to the ashing process when it next makes contact with the carrier. Accordingly, using a rotating magnetic field causes a dramatic increase in the number of chances for contact between the oxygen plasma and the carrier surface, resulting in an improvement in the carbon removal rate from the carrier surface per unit of time.

The rotating magnets are installed in opposing positions with the carrier sandwiched therebetween, but if the same poles of the opposing magnetic fields are synchronized with the same phase, then repulsion between the magnetic fields causes the plasma flow to lose uniformity, and therefore the matching poles are preferably in an asynchronous antiphase state. Furthermore, the rotating magnets used for forming the rotating magnetic fields may be positioned either inside or outside the ashing chamber, but because positioning a rotating body inside a vacuum environment, and applying a rotational drive force from externally to an internal rotating body are difficult and not preferable in terms of maintaining the degree of vacuum and the cleanliness, the rotating magnets are preferably positioned outside the chamber. Furthermore, the rotational speed of the magnets used for forming the rotating magnetic fields is typically within a range from 60 to 800 rpm, and is preferably from 300 to 600 rpm.

The generated oxygen plasma reacts with the accumulated carbon film on the carrier surface, converting the carbon to CO and $CO_2$. By using the exhaust pump 512 to externally discharge the completely gasified CO and $CO_2$, the carbon on the carrier surface is removed. When the ashing treatment is complete, the oxygen gas supply from the gas inlet tube 509 is halted, and any residual oxygen gas is discharged from the chamber using the exhaust pump 512. Subsequently, the gate valve provided on the chamber is opened, and transfer of the carrier out of the chamber 502 is commenced, but if the gate valve is opened before the CO and $CO_2$ gases generated inside the chamber 502 by the ashing treatment and the oxygen gas have been satisfactorily discharged from the chamber, then these gases are released into the next chamber, which is undesirable. Accordingly, once the ashing treatment has been completed, the exhaust volume control valve 506 is preferably immediately set to the maximum exhaust rate. Although dependent on the production rate of the sputtering apparatus as a whole, the exhaust volume control valve operation is typically completed in not more than 1.5 seconds, and ideally in not more than 0.5 seconds, thereby contributing to the discharge of the residual gases from the chamber. Furthermore, although dependent on the size of the chamber, the exhaust pump 512 has an exhaust rate that is typically 1,000 liters per second or greater, and preferably 2,000 liters per second or greater.

The ashing described in the present invention refers to a process of using a plasma to gasify and remove the carbon film accumulated on the carrier 503. Examples of the plasma generated during this process include an oxygen plasma, a hydrogen plasma or a halogen gas plasma. As described above, an oxygen plasma decomposes the carbon film into CO gas and $CO_2$ gas, whereas it is thought that a hydrogen plasma decomposes the carbon film into $CH_4$ gas or the like, and a halogen gas plasma decomposes the carbon film into a halide gas. Of these, the use of an oxygen gas plasma is preferred in terms of the carbon film removal rate.

As illustrated in FIG. 5, the formation of a metal film coating on the carrier in accordance with the present embodiment involves housing the carrier 503, with no substrate mounted thereon, inside the chamber 502 that is held in a vacuum state of not more than $1 \times 10^{-4}$ Pa, introducing a gas containing mainly argon from the gas inlet tube 509, using the exhaust volume control valve 506 to regulate the exhaust volume and hold the pressure inside the chamber within a range from 0.5 to 1.0 Pa, and then applying a direct current electrical power to the metal target material 505 from the power source 507. Either a direct current pulsed power or high-frequency power may be used, but in terms of achieving a favorable film formation rate per unit of time, the use of a direct current power is preferred, and a discharge is generated within a power range from 100 to 1,500 W. In terms of ensuring applicability with practical industrial production, the treatment is preferably completed within a time of approximately 1 to 5 seconds.

The electrical power applied to the target material causes ionization of the argon gas introduced into the chamber, thereby converting the gas to an argon plasma. In order to focus the generated argon plasma, the plasma is imparted with kinetic energy by the rotating magnets 504 positioned outside the chamber, causing the plasma to flow across the target material in a diagonal direction while sweeping out a helical trajectory. Upon impact with the surface of the target material, the argon gas plasma causes metal atoms of the target material to fly off, thereby causing sputtering. The argon plasma that does not contribute to the sputtering returns to the helical trajectory, and contributes to the sputtering process when it next impacts the target material. Accordingly, using a rotating magnetic field causes a dramatic increase in the number of chances for impact between the argon plasma and the target material, resulting in an improvement in the coating rate of the carrier surface per unit of time. The rotating magnets are installed in opposing positions with the target material and the carrier sandwiched therebetween, but if the same poles of the opposing magnetic fields are synchronized with the same phase, then repulsion between the magnetic fields causes the plasma flow to lose uniformity, and therefore the matching poles are preferably in an asynchronous antiphase state. Furthermore, the rotational speed of the rotating magnets used for forming the rotating magnetic fields is typically within a range from 60 to 800 rpm, and is preferably from 300 to 600 rpm.

The metal material used for coating the carrier in order to block the release of outgas may be either a magnetic material or a non-magnetic material, although if a film of a magnetic material is formed, then the carrier itself becomes magnetic, and therefore a non-magnetic material is preferably used. Furthermore, the material itself may be composed of either a single metal element or a metal alloy containing a plurality of elements, although an alloy composition that includes metal oxides is undesirable as it may result in the release of gas from the oxides. Moreover, the use of a metal material that exhibits a high level of oxidative reactivity is also undesirable.

Furthermore, when forming the film on the carrier surface, if the film is too thin, then the suppression effect on the outgas is minimal, whereas if the film is too thick, the total amount of the metal film formed on the carrier increases significantly, which may cause peeling of the film from the carrier, and also increases the frequency with which the carrier must be replaced. For these reasons, the film thickness is preferably within a range from 30 to 200 Å (3 to 20 nm), and is more preferably within a range from 50 to 100 Å (5 to 10 nm). Moreover, the film is preferably formed over the entire carrier surface, without installing the types of shields that are widely used for restricting the film formation region.

EXAMPLES

Examples of the carrier ashing and the formation of a metal film coating on the carrier according to the present invention are described below, although the present invention is not limited solely to these examples.

Examples 1 to 15

A non-magnetic substrate composed of a NiP-plated aluminum substrate was supplied to the chamber of a sputtering film formation apparatus using a substrate transport device, and the inside of the chamber was evacuated. Following completion of the evacuation process, the substrate transport device was used to mount the substrate on an A5052 aluminum alloy carrier within the vacuum environment inside the chamber. The surface of the carrier had been subjected to a sandblasting treatment with #20 to 30 SiC particles. An undercoat film composed of Cr and a magnetic recording layer composed of Co, which represent layers required to form the magnetic recording medium, were formed on the carrier-mounted substrate inside the sputtering chamber, and a carbon protective film of thickness 50 Å was then formed on the substrate by plasma CVD in a CVD chamber. At this time, carbon was also accumulated on the carrier surfaces near the substrate.

Subsequently, the substrate was removed from the carrier inside the chamber using the substrate transport device. The carrier from which the substrate had been removed was then transported into the next chamber. Subsequent treatments are described below using FIG. 5 for reference. Oxygen gas was supplied to the chamber from the gas inlet tube 509 shown in FIG. 5, and the exhaust volume control valve was operated to adjust the pressure inside the chamber to a value within a range from 1.5 to 5.5 Pa. Subsequently, a 13.56 MHz high-frequency bias electrical power of 300 to 500 W was applied to the carrier 503. At this time, the rotating magnets 504 were either rotated at a rotational speed of 600 rpm, or were removed from the apparatus. The treatment time within the oxygen plasma was within a range from 1.6 to 2.8 seconds. The treatment conditions, and the removal rate for the accumulated carbon film are detailed in Table 1. The removal rate for the accumulated carbon film was evaluated by measuring the carbon film thickness before and after the ashing treatment.

As is evident from Table 1, when the ashing was conducted in the presence of an introduced rotating magnetic field, the removal rate for the accumulated carbon film increased significantly, and the difference in the removal rates for the upper and lower surfaces of the carrier decreased.

Moreover, it was confirmed that a favorable ashing performance could be maintained even with a lower gas volume and a lower chamber pressure.

The phenomenon wherein a difference develops in the removal rates for the upper and lower surfaces of the carrier when the rotating magnetic field is not introduced is thought to reflect the fact that because the application of the high-frequency electrical power to the carrier is conducted via the upper surface of the carrier, the oxygen plasma is concentrated around this point of electrical power application, thereby increasing the removal rate on the upper surface. It is thought that introduction of the rotating magnetic field causes the oxygen plasma to be drawn uniformly around the vicinity of the carrier, resulting in more uniform ashing.

Moreover, it is thought that because the helical trajectory magnetic field improves the ionization efficiency of the oxygen gas, the discharge continues even under lower pressure, resulting in a more favorable ashing performance.

Example 16

A non-magnetic substrate composed of a NiP-plated aluminum substrate was supplied to the chamber of a sputtering film formation apparatus using a substrate transport device in the same manner as example 1, and the inside of the chamber was evacuated. Following completion of the evacuation process, the substrate transport device was used to mount the substrate on an A5052 aluminum alloy carrier within the vacuum environment inside the chamber. The surface of the carrier had been subjected to a sandblasting treatment with #20 to 30 SiC particles. An undercoat film composed of Cr and a magnetic recording layer composed of Co, which represent layers required to form the magnetic recording medium, were formed on the carrier-mounted substrate inside the sputtering chamber, and a carbon protective film of thickness 50 Å was then formed on the substrate by plasma CVD in a CVD chamber. At this time, carbon was also accumulated on the carrier surfaces near the substrate. Subsequently, the substrate was removed from the carrier inside the chamber using the substrate transport device. The carrier from which the substrate had been removed was then transported into the next chamber. Subsequent processes are described below using FIG. 5 for reference. Oxygen gas was supplied to the chamber from the gas inlet tube 509 shown in FIG. 5, and the exhaust volume control valve was operated to adjust the pressure inside the chamber to a value of 5.5 Pa. Subsequently, a 13.56 MHz high-frequency bias electrical power of 300 W was applied to the carrier 503. At this time, the rotating magnets 504 were rotated at a rotational speed of 600 rpm.

Following conducting an ashing treatment by exposure to an oxygen plasma discharge for 3.0 seconds, the supply of oxygen gas from the gas inlet tube 509 was halted, and the exhaust volume control valve was operated to exhaust all residual gas from inside the chamber. Subsequently, the carrier was transferred to the next chamber, 100% argon gas was supplied to the chamber, the pressure inside the chamber was held at 0.8 Pa, and a 1,000 W direct current was applied for 1 second from the power source 507 to the CrTi alloy target material 505, thereby causing magnetron sputtering of the CrTi alloy target material 505 in the presence of the rotating magnets 504, and forming a sputtered film of the material of the CrTi alloy target material 505 with a thickness of approximately 50 Å on the surface of the carrier. In this investigation, four targets were installed within the single chamber, enabling the film formation to be performed simultaneously on the two substrates mounted on the carrier. Further, in order to enable coating of the carrier over a wider area, the distance from the target material to the carrier surface was set to 75 mm, and the treatment was conducted without installing a shield for restricting the discharge region.

In order to confirm the effect of this metal film coating in suppressing the release of outgas from the carrier, a gas detector was installed in the chamber 506, and the gas components released into the chamber by the carrier were evaluated. The results of the evaluations are shown in Table 2.

Examples 17 to 22

A carrier ashing treatment and a metal film coating treatment were performed in the same manner as example 16. The treatment conditions and evaluation results are detailed in Table 2. In examples 21 and 22, the carrier ashing treatment and the metal film coating treatment were conducted within a single chamber.

As is evident from Table 2, when oxygen gas ashing was performed following the CVD film formation, the ion current-measuring type gas detector recorded an increase in the ion current values for CO and $CO_2$. This phenomenon was observed to display the same trend regardless of whether the ashing was conducted using a rotating magnetic field or without using a magnetic field. In contrast, when the metal film was formed on the carrier surface, there was a confirmed reduction in the ion current values for the above gas components. When the CrTi film was formed in the same chamber as that used for conducting the ashing treatment, no reduction in the ion current was observed. On the other hand, when a film of Ru was formed in the same chamber as that used for the ashing treatment, the ion current was reduced. These results are because the CrTi target installed inside the same chamber as that used for the oxygen ashing underwent oxidation, resulting in a marked deterioration in the film formation rate during the metal film coating treatment. This oxidation was confirmed by the fact that the voltage applied to the CrTi target during sputtering discharge of the target increased by approximately 15%, and the fact that the film thickness of the film actually formed on the substrate was reduced to only approximately 10% of the film thickness obtained when oxidation did not occur. On the other hand, in the case where a target material with a low oxidative reactivity such as Ru was used, even though the same chamber was used for the oxygen ashing and the metal film formation, the target material did not oxidize during the ashing treatment, the metal film formation rate did not decrease, and the emission of gas from the carrier was able to be suppressed.

to be effectively removed by ashing, meaning the problems caused when the film detaches to form particles that subsequently adhere to the substrate itself can be effectively suppressed.

Furthermore, by coating the residual film that remains on the carrier surface following ashing with a metal film, outgas from the carrier can be suppressed.

The invention claimed is:

TABLE 1

| | Magnetic field application | Oxygen supply rate (sccm) | Chamber pressure (Pa) | High-frequency electrical power (W) | Treatment time (seconds) | Accumulated carbon film removal rate (%) | | |
|---|---|---|---|---|---|---|---|---|
| | | | | | | Upper surface | Lower surface | Upper/lower difference |
| Example 1 | None | 500 | 5.5 | 300 | 2.8 | 27 | 21 | 6 |
| Example 2 | None | 500 | 5.5 | 400 | 2.8 | 39 | 31 | 8 |
| Example 3 | None | 500 | 5.5 | 500 | 2.8 | 54 | 40 | 14 |
| Example 4 | None | 400 | 4.5 | 500 | 2.8 | 29 | 23 | 6 |
| Example 5 | None | 300 | 3.5 | 500 | 2.8 | 30 | 22 | 8 |
| Example 6 | None | 200 | 2.5 | 500 | 2.8 | 25 | 21 | 4 |
| Example 7 | Rotating | 500 | 5.5 | 300 | 2.8 | 50 | 51 | −1 |
| Example 8 | Rotating | 500 | 5.5 | 300 | 2.4 | 42 | 41 | 1 |
| Example 9 | Rotating | 500 | 5.5 | 300 | 2.0 | 36 | 37 | −1 |
| Example 10 | Rotating | 500 | 5.5 | 300 | 1.6 | 28 | 28 | 0 |
| Example 11 | Rotating | 500 | 5.5 | 400 | 1.6 | 77 | 78 | −1 |
| Example 12 | Rotating | 500 | 5.5 | 500 | 1.6 | 93 | 94 | −1 |
| Example 13 | Rotating | 300 | 3.5 | 500 | 1.6 | 52 | 53 | −1 |
| Example 14 | Rotating | 200 | 2.5 | 500 | 1.6 | 52 | 53 | −1 |
| Example 15 | Rotating | 100 | 1.5 | 500 | 1.6 | 55 | 56 | −1 |

TABLE 2

| | CVD (Å) | Ashing | | Rotating magnetic field | Metal film coating | | Thickness (Å) | Ion current (A) | |
|---|---|---|---|---|---|---|---|---|---|
| | | Chamber | Output (W) | | Chamber | Material | | CO | $CO_2$ |
| Example 16 | 50 Å | 3A | 300 | Yes | 3B | CrTi | 50 | 2.3E−12 | 4.5E−12 |
| Example 17 | 0 | | None | | 3B | CrTi | 1,000 | 1.4E−12 | 1.4E−12 |
| Example 18 | 50 Å | 3A | 300 | No | | None | | 1.2E−11 | 2.3E−11 |
| Example 19 | 50 Å | | None | | | None | | 8.0E−12 | 7.4E−12 |
| Example 20 | 50 Å | 3A | 300 | Yes | | None | | 1.5E−11 | 2.5E−11 |
| Example 21 | 50 Å | 3A | 300 | Yes | 3A | CrTi | 5 | 1.1E−11 | 2.3E−11 |
| Example 22 | 50 Å | 3A | 300 | Yes | 3A | Ru | 50 | 1.9E−12 | 3.0E−12 |

INDUSTRIAL APPLICABILITY

According to the method for manufacturing a magnetic recording medium of the present invention, which employs ashing of the accumulated carbon film on the substrate-supporting carrier and a cleanliness retention technique that uses a metal film coating, when a carbon protective film is formed on both surfaces of the magnetic recording medium substrate, the carbon film that accumulates on the carrier surface is able 1. A method for manufacturing a magnetic recording medium by mounting a substrate for film formation on a carrier whose surface has been roughened, sequentially transporting said substrate into a plurality of connected chambers, and forming at least a magnetic film and a carbon protective film on said substrate for film formation within said chambers, wherein said method comprises a step of conducting ashing to remove an accumulated carbon protective film adhered to a carrier surface, which is performed following a step of removing a magnetic recording medium from said carrier following film formation, but prior to a step of mounting a new substrate for film formation on said carrier, and said method further comprises a step of forming a metal film on a carrier surface, which is performed following said step of conducting ashing to remove an accumulated carbon protective film adhered to a carrier surface, but prior to the step of mounting a new substrate for film formation on said carrier.

2. The method for manufacturing a magnetic recording medium according to claim 1, wherein said step of conducting ashing to remove an accumulated carbon protective film adhered to a carrier surface and said step of forming a metal film on a carrier surface are conducted within a single chamber.

3. The method for manufacturing a magnetic recording medium according to claim 1, wherein said ashing to remove an accumulated carbon protective film adhered to a carrier surface is conducted using a plasma comprising oxygen.

4. The method for manufacturing a magnetic recording medium according to claim 3, wherein an external magnetic field is applied to said plasma comprising oxygen, thereby concentrating a plasma causing said ashing at a carrier surface.

5. The method for manufacturing a magnetic recording medium according to claim 4, wherein said magnetic field applied to said plasma during said ashing step is a rotating magnetic field that sweeps out a helical trajectory.

6. The method for manufacturing a magnetic recording medium according to claim 1, wherein said step of forming a metal film on a carrier surface is conducted by a magnetron discharge sputtering method that uses rotating magnetic field assistance.

7. The method for manufacturing a magnetic recording medium according to claim 1, wherein said metal film formed on a carrier surface is a metal material having low oxidative reactivity.

8. The method for manufacturing a magnetic recording medium according to claim 7, wherein said metal material having low oxidative reactivity comprises one element selected from the group consisting of Ru, Au, Pd and Pt.

9. The method for manufacturing a magnetic recording medium according to claim 1, wherein said step of conducting ashing to remove an accumulated carbon protective film adhered to a carrier surface and said step of forming a metal film on a carrier surface are conducted in different chambers.

10. The method for manufacturing a magnetic recording medium according to claim 1, wherein the thickness of said metal film is within a range from 50 to 100 Å.

11. The method for manufacturing a magnetic recording medium according to claim 8, wherein said metal material having low oxidative reactivity comprises Ru.

12. A method for manufacturing a magnetic recording medium by mounting a substrate for film formation on a carrier whose surface has been roughened, sequentially transporting said substrate into a plurality of connected chambers, and forming at least a magnetic film and a carbon protective film on said substrate for film formation within said chambers, wherein said method comprises a step of conducting ashing to remove an accumulated carbon protective film adhered to a carrier surface, which is performed following a step of removing a magnetic recording medium from said carrier following film formation, but prior to a step of mounting a new substrate for film formation on said carrier, said method further comprises a step of forming a metal film on a carrier surface, which is performed following said step of conducting ashing to remove an accumulated carbon protective film adhered to a carrier surface, but prior to the step of mounting a new substrate for film formation on said carrier, and the step of conducting ashing on the carrier surface is performed within a chamber that is different from the chambers for forming the films on the substrate.

13. The method for manufacturing a magnetic recording medium according to claim 12, wherein said step of conducting ashing to remove an accumulated carbon protective film adhered to a carrier surface and said step of forming a metal film on a carrier surface are conducted in different chambers, the thickness of said metal film is within a range from 50 to 100 Å, and said metal film formed on a carrier surface is a metal material having low oxidative reactivity.

14. A method for manufacturing a magnetic recording medium comprising (i) mounting a substrate for film formation on a carrier, (ii) sequentially transporting said substrate into a plurality of connected chambers to form at least a magnetic film and a carbon protective film on said substrate for film formation within said chambers and obtain a magnetic recording medium which has the magnetic film and the carbon protective film on the substrate, wherein the carbon protective film is formed by plasma CVD method, (iii) removing the magnetic recording medium from the carrier, (iv) conducting ashing of the carrier using an oxygen plasma to remove an carbon protective film which is accumulated in the step (ii) on a carrier surface of the carrier, (v) forming a metal film on the carrier surface of the carrier treated in the step (iv), wherein steps (i) to (v) are performed in sequence at least twice.

15. The method for manufacturing a magnetic recording medium according to claim 14, wherein the step (iv) is performed within a chamber that is different from the chambers for step (ii), said step (iv) and said step (v) are conducted in different chambers, the surface of the carrier has been roughened prior to step (i), the thickness of said metal film is within a range from 50 to 100 Å, and said metal film formed on a carrier surface is a metal material having low oxidative reactivity.

* * * * *